United States Patent [19]
Togawa

[11] Patent Number: 6,121,686
[45] Date of Patent: *Sep. 19, 2000

[54] BALL GRID ARRAY PACKAGE HAVING THROUGH-HOLES DISPOSED IN THE SUBSTRATE UNDER THE CHIP

[75] Inventor: Miyoshi Togawa, Oita, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/910,330

[22] Filed: Aug. 13, 1997

[30] Foreign Application Priority Data

Aug. 13, 1996 [JP] Japan ................................. 8-213671

[51] Int. Cl.⁷ .................................................. H01L 23/18
[52] U.S. Cl. ........................... 257/778; 257/698; 257/738; 257/773; 257/780; 257/786
[58] Field of Search ..................................... 257/738, 697, 257/692, 698, 700, 706, 707, 730, 737, 773, 774, 778, 779, 780, 786

[56] References Cited

U.S. PATENT DOCUMENTS

| 5,598,036 | 1/1997 | Ho ............................................ 257/738 |
| 5,708,567 | 1/1998 | Shim et al. .............................. 361/723 |
| 5,772,451 | 6/1998 | Dozier, II et al. ........................ 439/70 |
| 5,894,410 | 4/1999 | Barrow ..................................... 361/760 |

FOREIGN PATENT DOCUMENTS 95-41438  11/1995  Rep. of Korea ...................... 361/723

*Primary Examiner*—Jerome Jackson, Jr.
*Assistant Examiner*—Bradley William Baumeister
*Attorney, Agent, or Firm*—Hill & Simpson

[57] ABSTRACT

Disclosed is a semiconductor device for improving a resistance against barrel cracks of an insulating substrate on which a semiconductor chip is mounted, thereby enhancing a reliability of the semiconductor device. A plurality of through-holes provided in a BGA substrate for electrically connecting electrodes of a semiconductor chip to packaging electrodes are arranged inside a region of the BGA substrate in which the semiconductor chip is mounted. When the semiconductor device undergoes temperature changes, a larger extension/contraction force is applied to the lower portion of the BGA substrate as compared with the upper portion thereof, and such an expansion/contraction force becomes larger at a position more apart from the center of the BGA substrate. As a result, a through-hole at a position more apart from the BGA substrate is applied to a larger stress. However, since the plurality of through-holes are arranged inside the region of the BGA substrate in which the semiconductor chip is mounted, the stress applied to each through-hole can be reduced. This is effective to suppress occurrence of barrel cracks.

9 Claims, 4 Drawing Sheets

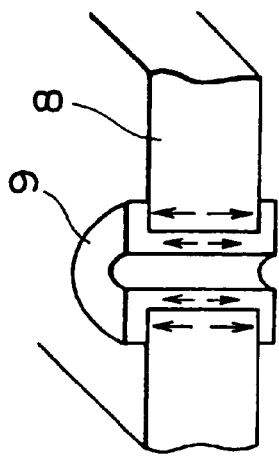
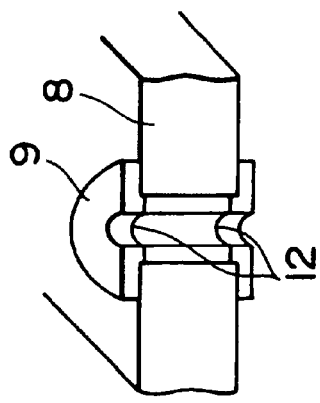
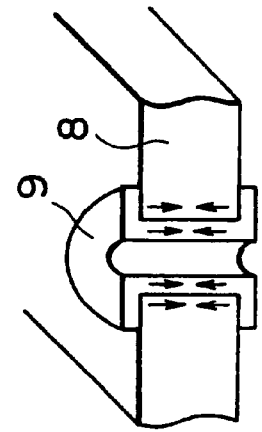
FIG. 3A  HIGH TEMPERATURE (150°C)
FIG. 3B  ORDINARY TEMPERATURE (25°C)
FIG. 3C  LOW TEMPERATURE (−65°C)

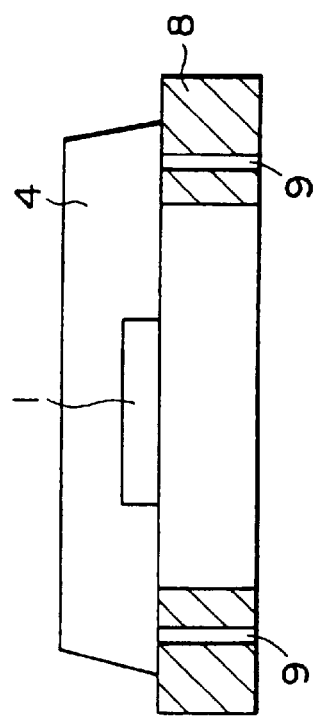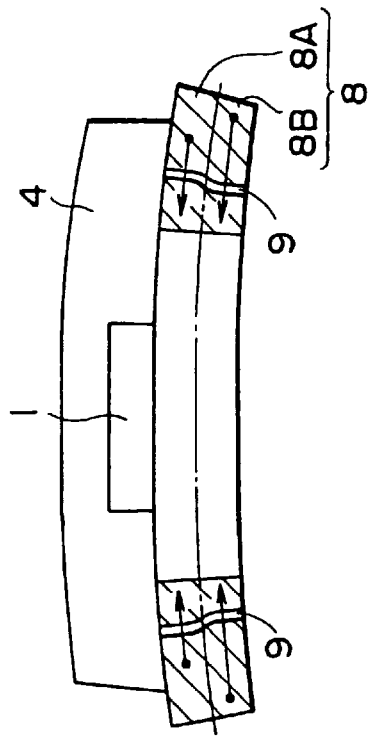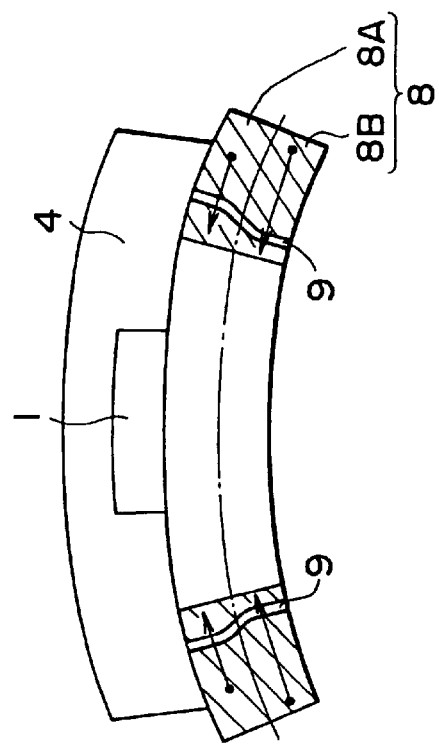

BALL GRID ARRAY PACKAGE HAVING THROUGH-HOLES DISPOSED IN THE SUBSTRATE UNDER THE CHIP

BACKGROUND OF THE INVENTION

The present invention relates to a semiconductor device, particularly, a semiconductor device in which electrodes of a semiconductor chip mounted on the front surface of an insulating substrate are electrically connected via through-holes to packaging electrodes provided on the back surface of the insulating substrate.

A BGA (Ball Grid Array) package has been known as one of packages for semiconductor devices such as ICs and LSIs. In the BGA package, a semiconductor chip is mounted on the front surface of a BGA substrate composed of an insulating substrate; ball-like electrodes are provided on the back surface of the BGA substrate; and electrodes of the semiconductor chip are electrically connected to the ball-like electrodes via a plurality of through-holes provided in the BGA substrate.

Compared with a package having a structure in which packaging leads project from side surfaces of the package, such a BGA package having ball-like electrodes as packaging electrodes disposed over the entire back surface of a BGA substrate has an advantage that a multi-pin structure can be adopted for mounting a semiconductor device on a wiring substrate without occupation of an additional space on the wiring substrate.

FIG. 2A is a sectional view of a related art BGA package, and FIG. 2B is a schematic top view of the BGA package shown in FIG. 2A. In these figures, reference numeral 1 indicates a semiconductor chip; 2 is Ag paste; 3 is a die pad for fixing the semiconductor chip 1; 4 is mold resin; 5 is a Au bonding wire; 6 is an inner lead; and 7 is a solder resist.

Reference numeral 8 indicates a BGA substrate made from a material shown in Table 1.

TABLE 1

| linear expansion coefficient (1/° C.) | |
|---|---|
| prepleg (BT + glass cloth) | copper |
| X: 1.4 × 1/10$^6$<br>Y: 1.6 × 1/10$^6$<br>Z: 4.7 × 1/10$^6$ | 1.6 × 1/10$^5$ |

Reference numeral 9 indicates a plurality of through-holes provided in the BGA substrate 8. Each of the through-holes is formed of copper foil. Reference numeral 10 indicates a plurality of ball-like electrodes formed of solder balls, which are provided on the back surface of the BGA substrate 8. Here, as shown by hatching in FIG. 2B, the plurality of through-holes 9 are arranged outside a region 11 of the BGA substrate 8 in which the semiconductor chip 1 is mounted.

Incidentally, a semiconductor device having such a BGA package has a problem in causing barrel cracks upon a temperature cycle test performed after assembly of the semiconductor device, resulting in the degraded reliability.

The barrel crack is such a phenomenon that when a semiconductor device undergoes temperature changes by repeated cycles between a high temperature and a low temperature, copper foil of through-holes is disconnected due to a difference in thermal expansion coefficient between a prepleg constituting a BGA substrate and the copper foil. The occurrence of these barrel cracks possibly cuts off electric connection between electrodes of a semiconductor chip and ball-like electrodes.

FIGS. 3A to 3C are schematic views illustrating a mechanism of occurrence of barrel cracks. When a semiconductor device undergoes temperature changes by repeated cycles between a high temperature region A (for example, 150° C.) and a low temperature region C (for example, −65° C.), a prepleg and copper foil are both extended as shown by arrows in the high temperature region A; while they are both contracted as shown by arrows i the low temperature range C. As a result, there occur barrel cracks 12 due to a difference in thermal expansion coefficient between the prepleg and the copper foil.

FIGS. 4A to 4C are schematic views illustrating another mechanism of occurrence of barrel cracks. In an ordinary temperature region B (25° C.), stress acts as shown by arrows due to a difference in thermal expansion coefficient between the prepleg and the copper foil, and thereby the BGA substrate 8 constituting the BGA package warps as shown in FIG. 4B and the mold resin 4 correspondingly warps. Specifically, a lower portion 8B of the BGA substrate 8 is contracted larger than an upper portion 8A of the BGA substrate 8 does, so that lower portions of the through-holes 9 warp inward. In the high temperature region A, the warping of the BGA substrate 8 is corrected and the BGA substrate 8 is flattened, so that the through-holes 9 are straightly kept. On the other hand, in the low temperature region C., the degree of the warping of the BGA substrate 8 becomes larger and the degree of the warping of the mold resin 4 correspondingly becomes larger, with a result that the lower portions of the though-holes 9 further warp inward.

In this way, when temperature changes are given to the semiconductor device, a larger extension/contraction force is applied to the lower portion 8B of the BGA substrate 8 as compared with the upper portion 8A of the BGA substrate 8. Further, the expansion/contraction force becomes larger at a position more apart from the center of the BGA substrate 8, and consequently a through-hole 9 positioned more apart from the BGA substrate 8 is applied to the larger stress. Accordingly, in the related art structure in which the plurality of the through-holes 9 are arranged outside the region 11 of the BGA substrate 8 in which the semiconductor chip 1 is mounted, there easily occur the barrel cracks 12.

SUMMARY OF THE INVENTION

An object of the present invention is to provide a semiconductor device capable of improving a resistance against barrel cracks of an insulating substrate on which a semiconductor chip is mounted for enhancing a reliability of the semiconductor device.

To achieve the above object, according to the present invention, there is provided a semiconductor device including: a semiconductor chip mounted on the front surface of an insulating substrate; packaging electrodes provided on the back surface of said insulating substrate; and a plurality of through-holes, provided in said insulating substrate, for electrically connecting electrodes of said semiconductor chip to said packaging electrodes; wherein said plurality of through-holes are arranged inside a region of said insulating substrate in which said semiconductor chip is mounted.

In the semiconductor device of the present invention, as described above, a plurality of through-holes provided in an insulating substrate for electrically connecting electrodes of a semiconductor chip to packaging electrodes are arranged inside a region of the insulating substrate in which the semiconductor chip is mounted. As a result, when the semiconductor device undergoes temperature changes, an expansion/contraction force applied to the through-holes can be relieved. Accordingly, it becomes possible to improve a resistance against barrel cracks of the insulating substrate on which the semiconductor chip is mounted and hence to enhance a reliability the semiconductor device.

BRIEF DESCRIPTION OF THE DRAWINGS

FIGS. 1A and 1B are views showing an embodiment of a semiconductor device according to the present invention, wherein FIG. 1A is a sectional view of the semiconductor device; and FIG. 1B is a schematic top view of the semiconductor device;

FIGS. 2A and 2B are views showing a related art semiconductor device, wherein FIG. 2A is a sectional view of the semiconductor device and FIG. 2B is a schematic top view of the semiconductor device;

FIGS. 3A to 3C are views illustrating a mechanism of occurrence of barrel cracks in a semiconductor device; and FIGS. 4A to 4C are views illustrating another mechanism of occurrence of barrel cracks in a semiconductor device.

DETAILED DESCRIPTION OF THE PREFERRED EMBODIMENT

Hereinafter, one embodiment of the present invention will be described with reference to the drawings.

Figure 1A:
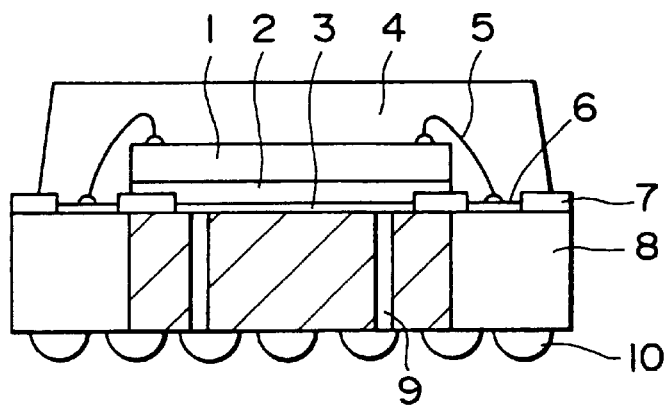
Figure 1B:
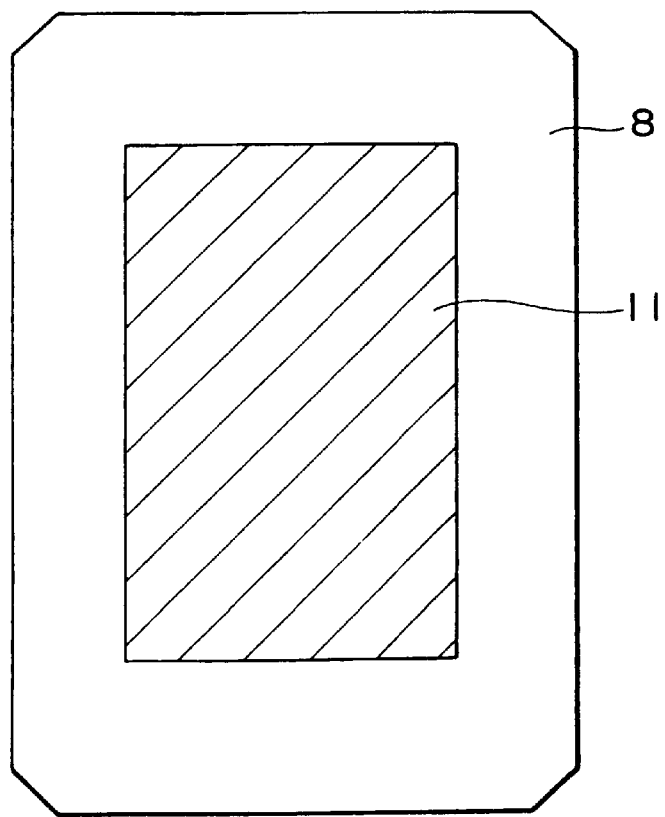
Figure 2A:
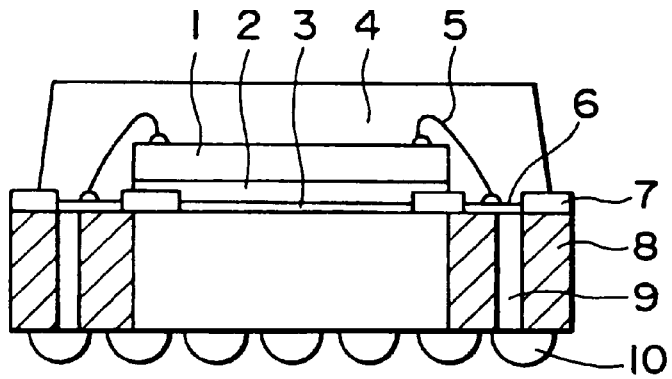
Figure 2B:
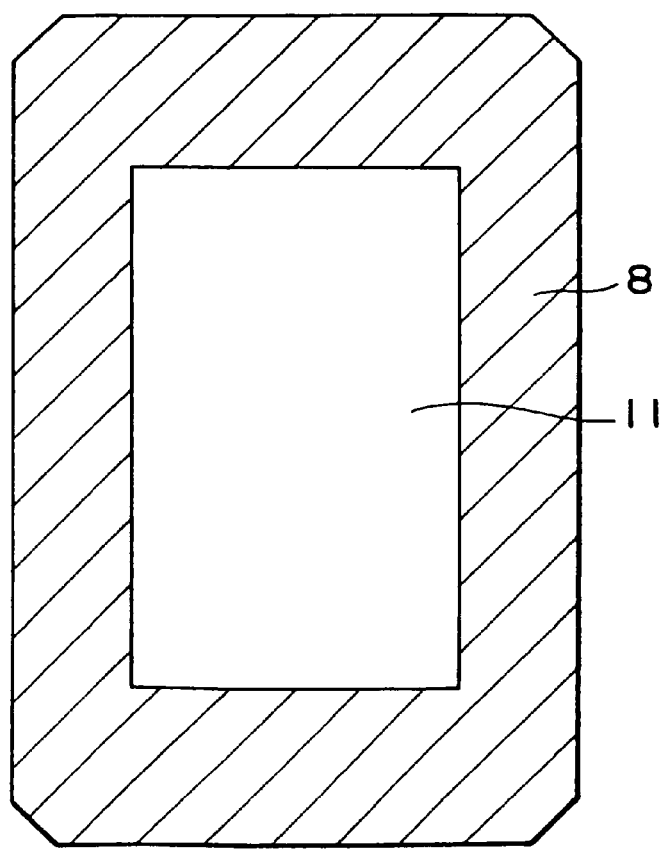

FIGS. 1A and 1B are views showing one embodiment of a semiconductor device according to the present invention, wherein FIG. 1A is a sectional view of the semiconductor device, and FIG. 1B is a schematic top view of the semiconductor device.

In these figures, reference numeral 1 indicates a semiconductor chip; 2 is Ag paste; 3 is a die pad for fixing the semiconductor chip 1; 4 is mold resin; 5 is a Au bonding wire; 6 is an inner lead; 7 is a solder resist; and 8 is a BGA substrate made from the material shown in Table. 1.

Reference numeral 9 indicates a plurality of through-holes formed of copper foil. The through-holes 9 are arranged inside a region 11 of the BGA substrate 8 in which the semiconductor chip 1 is mounted. Reference numeral 10 indicates a plurality of ball-like electrodes formed of solder balls provided on the back surface of the BGA substrate 8. Although the ball-like electrodes are arranged outside the above region 11, they are electrically connected to the corresponding through-holes with extending wiring (not shown).

In this semiconductor device of the present invention, the plurality of through-holes 9 provided on the BGA substrate 8 for electrically connecting the electrodes of the semiconductor chip 1 to the ball-like electrodes 10 are arranged inside the region 11 of the BGA substrate 8 in which the semiconductor chip 1 is mounted, and accordingly, when the semiconductor device undergoes temperature changes, an expansion/contraction force applied to the through-holes 9 is relieved.

In general, when a semiconductor device undergoes temperature changes, a larger extension/contraction force is applied to the lower portion 8B of the BGA substrate 8 as compared with the upper portion 8A of the BGA substrate 8 as described with reference to FIGS. 3 and 4, and such an expansion/contraction force becomes larger at a position more apart from the center of the BGA substrate 8. As a result, a through-hole 9 at a position more apart from the BGA substrate 8 is applied to a larger stress.

According to the present invention, however, since the plurality of through-holes 9 are arranged inside the region 11 of the BGA substrate 8 in which the semiconductor chip 1 is mounted, the stress applied to each through-hole 9 can be reduced. This is effective to suppress occurrence of barrel cracks. Accordingly, it is possible to significantly improve a resistance against barrel cracks, and hence to enhance a reliability of the semiconductor device.

Although the BGA substrate is used in the above-described embodiment, the present invention is not limited thereto. For example, other insulating substrates may be used insofar as each of the substrates is provided with through-holes for electrically connecting electrodes of a semiconductor chip to packaging electrodes. The present invention can be also applied to semiconductor devices of a flip-chip type in which wire bonding for electrodes of a semiconductor chip is omitted. Additionally, the package is not necessarily limited to a resin mold type.

While the preferred embodiment of the present invention has been described using the specific terms, such description is for illustrative purposes only, and it is to be understood that many changes and variations may be made without departing from the spirit or scope of the following claims.

What is claimed is:

1. A semiconductor device comprising:

a semiconductor chip mounted on a front surface of an insulating substrate;

packaging electrodes provided on a back surface of said insulating substrate; and a plurality of through-holes, provided in said insulating substrate, and electrically connecting electrodes of said semiconductor chip to said packaging electrodes;

wherein said plurality of through-holes are arranged exclusively inside a region of said insulating substrate in which said semiconductor chip is mounted and spaced apart from edge regions of the chip, and all of said packaging electrodes are arranged exclusively outside the region of the insulating substrate in which said semiconductor chip is mounted;

wherein the semiconductor chip is secured directly on the front surface of the insulating substrate.

2. A semiconductor device according to claim 1, wherein said packaging electrodes comprises a plurality of ball-like electrodes disposed on the back surface of said insulating substrate.

3. A semiconductor device according to claim 1, wherein said insulating substrate comprises a ball grid array substrate.

4. A semiconductor device according to claim 1, wherein all of said plurality of through-holes are entirely spaced apart from edge regions of the chip toward a center of the chip.

5. A semiconductor device according to claim 4, wherein said plurality of through-holes are spaced apart from edge regions of the chip such that barrel cracks in said plurality of through-holes are avoided when the semiconductor device is repeatedly cycled between temperature of from about −65° C. to about 150° C.

6. A semiconductor device comprising:

a semiconductor chip mounted on a front surface of an insulating substrate;

packaging electrodes provided on a back surface of said insulating substrate; and a plurality of through-holes, provided in said insulating substrate, and electrically connecting electrodes of said semiconductor chip to said packaging electrodes;

wherein said plurality of through-holes are arranged inside a region of said insulating substrate in which said semiconductor chip is mounted, and all of said packaging electrodes are arranged exclusively outside the region of the insulating substrate in which said semiconductor chip is mounted;

wherein the semiconductor chip is secured directly on the top surface of the insulating substrate.

7. A semiconductor device according to claim 6, wherein all of said plurality of through-holes are entirely spaced apart from edge regions of the chip toward a center of the chip.

8. A semiconductor device according to claim 7, wherein said plurality of through-holes are spaced apart from edge regions of the chip such that barrel cracks in said plurality of through-holes are avoided when the semiconductor device is repeatedly cycled between temperatures of from about −65° C. to about 150° C.

9. A semiconductor device comprising:
a semiconductor chip mounted on a front surface of an insulating substrate;
packaging electrodes provided on a back surface of said insulating substrate; and
a plurality of through-holes, provided in said insulating substrate, and electrically connecting electrodes of said semiconductor chip to said packaging electrodes;
wherein said plurality of through-holes are arranged exclusively inside a region of said insulating substrate in which said semiconductor chip is mounted, all of said plurality of through-holes being entirely spaced apart from edge regions of the chip toward a center of the chip;
wherein the semiconductor chip is secured directly on a front surface of the insulating substrate.

* * * * *